(12) United States Patent
Lee et al.

(10) Patent No.: US 12,132,006 B2
(45) Date of Patent: Oct. 29, 2024

(54) SEMICONDUCTOR PACKAGE STRUCTURE

(71) Applicant: Advanced Semiconductor Engineering, Inc., Kaohsiung (TW)

(72) Inventors: Pao-Nan Lee, Kaohsiung (TW); Chen-Chao Wang, Kaohsiung (TW); Chang Chi Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 29 days.

(21) Appl. No.: 17/566,579

(22) Filed: Dec. 30, 2021

(65) Prior Publication Data
US 2023/0215810 A1 Jul. 6, 2023

(51) Int. Cl.
| | |
|---|---|
| *H01L 23/31* | (2006.01) |
| *H01L 23/552* | (2006.01) |
| *H01L 25/16* | (2023.01) |
| *H01L 49/02* | (2006.01) |

(52) U.S. Cl.
CPC ........ *H01L 23/552* (2013.01); *H01L 23/3121* (2013.01); *H01L 25/16* (2013.01); *H01L 28/10* (2013.01); *H01L 28/40* (2013.01)

(58) Field of Classification Search
CPC .............. H01L 23/552; H01L 23/3121; H01L 23/3128; H01L 23/3135; H01L 23/645; H01L 25/16; H01L 25/165; H01L 28/10; H01L 28/40
See application file for complete search history.

(56) References Cited

U.S. PATENT DOCUMENTS

| | | | |
|---|---|---|---|
| 10,249,580 B2 | 4/2019 | Kim et al. | |
| 2002/0172025 A1* | 11/2002 | Megahed | H01L 25/0655 361/767 |
| 2016/0086930 A1* | 3/2016 | Koey | H01L 24/20 257/773 |
| 2017/0103946 A1* | 4/2017 | Chang | H01L 23/5223 |
| 2018/0040547 A1* | 2/2018 | Zuo | H01L 28/40 |
| 2020/0035603 A1* | 1/2020 | Rubin | H01L 25/0652 |
| 2020/0211959 A1 | 7/2020 | Hou et al. | |
| 2022/0344287 A1* | 10/2022 | Yu | H01L 25/16 |

\* cited by examiner

*Primary Examiner* — Omar F Mojaddedi
(74) *Attorney, Agent, or Firm* — FOLEY & LARDNER LLP

(57) ABSTRACT

A semiconductor package structure is provided. The semiconductor package structure includes an electronic component, and an inductance component. The protection layer encapsulates the electronic component and has a top surface and a bottom surface. The top surface and the bottom surface collectively define a space to accommodate the electronic component. The inductance component outflanks the space from the top surface and the bottom surface of the protection layer.

17 Claims, 17 Drawing Sheets

SEMICONDUCTOR PACKAGE STRUCTURE

BACKGROUND

1. Field of the Disclosure

The present disclosure relates to a semiconductor package structure, and in particular to a semiconductor package structure integrating power source and passive components.

2. Description of the Related Art

When a passive component, such as an inductor, is integrated with power source, the distance therebetween and the size of the passive component affect the performance of the passive component. However, it is difficult to satisfy both requirements for shorter distance and increased size of the passive component. In order to enhance the performance of the passive component, a new semiconductor package structure is thus required.

SUMMARY

In some embodiments, a semiconductor package structure includes an electronic component, and an inductance component. The protection layer encapsulates the electronic component and has a top surface and a bottom surface. The top surface and the bottom surface collectively define a space to accommodate the electronic component. The inductance component outflanks the space from the top surface and the bottom surface of the protection layer.

In some embodiments, a semiconductor package structure includes a protection layer, an inductance component, and an electronic component. The protection layer has a first surface. The inductance component is configured to receive a power and has a first portion overlapped with the protection layer in a lateral side view and a second portion on the first surface of the protection layer. The electronic component is electrically connected to the inductance component.

In some embodiments, a semiconductor package structure includes a protection layer, a first circuit, and an electronic component. The protection layer has a first surface and a second surface opposite to the first surface. The first circuit extends from the first surface of the protection layer to the second surface of the protection layer and configured to regulate a power. The electronic component is adjacent to the protection layer and configured to receive a regulated power from the first circuit.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
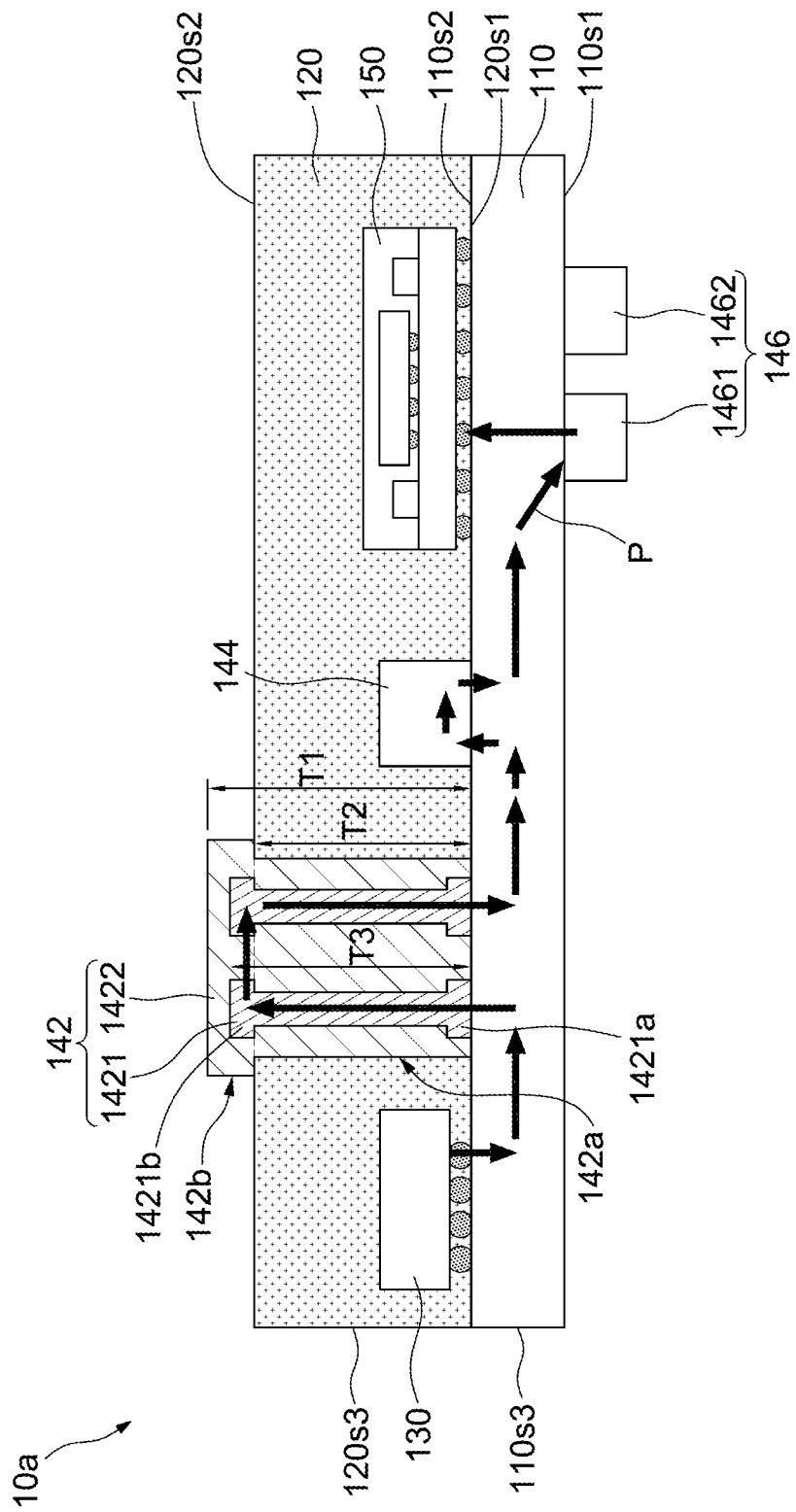
FIG. 1 illustrates a cross-sectional view of an example of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of an example of a semiconductor package structure 10a according to some embodiments of the present disclosure. In some embodiments, the semiconductor package structure 10a may include a carrier 110, a protection layer 120, a power source 130, at least one inductance component 142, at least one capacitance component 144, at least one capacitance component 146 and an electronic component 150.

The carrier 110 may be configured to support the protection layer 120 and/or other components. In some embodiments, the carrier 110 may include at least one dielectric layer and a redistribution structure or traces (not shown), for electrical connection between components, embedded in the dielectric layer. In some embodiments, the carrier 110 may include a circuit board, such as a paper-based copper foil laminate, a composite copper foil laminate, or a polymer-impregnated glass-fiber-based copper foil laminate. In some embodiments, the carrier 110 may include a semiconductor substrate. For example, the carrier 110 may include silicon, germanium, or other suitable materials. The carrier 110 may have a surface 110$s$1 (or a lower surface), a surface 110$s$2 (or an upper surface) opposite to the surface 110$s$1, and a surface 110$s$3 (or a lateral surface) extending between the surfaces 110$s$1 and 110$s$2.

The protection layer 120 may be disposed on the surface 110$s$2 of the carrier 110. The protection layer 120 may include insulation or dielectric material. In some embodiments, the protection layer 120 may be molding material that may include, for example, Novolac-based resin, epoxy-based resin, silicone-based resin, or other suitable encapsulant. Suitable fillers may also be included, such as powdered $SiO_2$. The protection layer 120 may have a surface 120$s$1 (or a lower surface), a surface 120$s$2 (or an upper surface) opposite to the surface 120$s$1, and a surface 120$s$3 (or a lateral surface) extending between the surfaces 120$s$1 and 120$s$2. The surface 120$s$1 of the protection layer 120 may face or be in contact with the surface 110$s$2 of the carrier 110. In some embodiments, the surface 120$s$3 of the protection layer 120 may be substantially coplanar with the surface 110$s$3 of the carrier 110. In some embodiments, each of the surfaces 120$s$2 and 120$s$3 of the protection layer 120 may be referred to as an external surface, respectively.

The power source 130 may be electrically connected to the carrier 110. The power source 130 may be configured to inject power into a circuit, control or amplify signals, which may include time-varying voltage, current, electromagnetic wave, photon, or other signals. The power source 130 may include input/outputs (I/Os) terminals, which may be used to receive and transmit signals, respectively. In some embodiments, the power source 130 may include a power management integrated circuit (PMIC), a voltage regulator electrically connected to the PMIC, and other suitable components. In some embodiments, the power source 130 may be disposed on the surface 110$s$2 of the carrier 110. For example, the terminals of the power source 130, such as solder balls or conductive pads, may be electrically connected to the carrier 110. In some embodiments, the power source 130 may be adjacent to the surface 120$s$1 of the protection layer 120. In some embodiments, the power source 130 may be embedded in or disposed within the protection layer 120. The arrow of the denotation "P" shown in FIG. 1 indicates a power routing path.

The inductance component 142 may be configured to regulate a power provided by the power source 130. In some embodiments, the inductance component 142 may be electrically connected between the power source 130 and the electronic component 150. In some embodiments, the inductance component 142 may be disposed on the surface 110$s$2 of the carrier 110. In some embodiments, the inductance component 142 may extend from the surface 120$s$1 of the protection layer 120 to the surface 120$s$2 of the protection layer 120. In some embodiments, the inductance component 142 may fully penetrate the protection layer 120. In some embodiments, the inductance component 142 have a portion 142$a$ embedded in the protection layer 120 and a portion 142$b$ protruding from the surface 120$s$2 of the protection layer 120. In some embodiments, the thickness (or height) T1 of the inductance component 142 (e.g., the sum of the thicknesses of the portions 142$a$ and 142$b$) may be equal to or greater than the thickness T2 of the protection layer 120 (e.g., the distance between the surfaces 120$s$1 and 120$s$2 of the protection layer 120). In some embodiments, the inductance component 142 may include a conductive structure 1421 and a dielectric layer 1422. In some embodiments, the inductance component 142 may be referred to as a first circuit. As shown in FIG. 1, the power P may be transmitted from the power source 130 to the inductance component 142 through the carrier 110.

The conductive structure 1421 may include electrically conductive materials, such as aluminum (Al), copper (Cu), tungsten (W), titanium (Ti), tantalum (Ta), or other applicable materials. In some embodiments, the conductive structure 1421 may be embedded in or covered by the dielectric layer 1422. In some embodiments, the conductive structure 1421 may be physically separated from the protection layer 120 by the dielectric layer 1422. The conductive structure 1421 may include portions 1421$a$ and 1421$b$. The portion 1421$a$ of the conductive structure 1421 may extend between the surfaces 120$s$1 and 120$s$2 of the protection layer 120. The portion 1421$b$ of the conductive structure 1421 may protrude from the surface 120$s$2 of the protection layer 120. In some embodiments, the thickness (or height) T3 of the conductive structure 1421 (e.g., the sum of the thicknesses of the portions 1421$a$ and 1421$b$) may be greater than the thickness T2 of the protection layer 120.

The dielectric layer 1422 may cover the conductive structure 1421. In some embodiments, the dielectric layer 1422 may have a portion embedded in the protection layer 120 and a portion disposed on the surface 120$s$2 of the protection layer 120. In some embodiments, the material of the dielectric layer 1422 may be different from that of the protection layer 120. In some embodiments, the dielectric layer 1422 may be configured to enhance the inductance of the inductance component 142. In some embodiments, the dielectric layer 1422 may include, for example, magnetic materials. The magnetic materials may include a ferromagnetic material. The magnetic materials may include at least one of ferrite and metal magnetic material. The magnetic materials may include Fe-based amorphous powder, Ni—Zn ferrite, Mn—Zn ferrite or other suitable materials. The Fe-based amorphous powder may be a composite, including Fe, Si, B, Cr, C or other elements, coated by a dielectric layer, such as $SiO_2$. When the dielectric layer 1422 includes magnetic materials, the inductance of the inductance component 142 can be enhanced.

The capacitance component 144 may be electrically connected between the inductance component 142 and the electronic component 150. The capacitance component 144 may be configured to regulate the power provided by the power source 130. In some embodiments, the capacitance component 144 may be configured to filter high frequency signal or low frequency signal. In some embodiments, the capacitance component 144 may include a deep trench capacitor (DTC), a multi-layer ceramic capacitor (MLCC) or other capacitors. In some embodiments, the capacitance component 144 may be disposed on or in contact with the surface 110$s$2 of the carrier 110. In some embodiments, the capacitance component 144 may be adjacent to the surface 120$s$1 of the protection layer 120. In some embodiments, the capacitance component 144 may be disposed within the protection layer 120. In some embodiments, the inductance component 142 and the capacitance component 144 may be collaboratively referred to as a first circuit. In some embodiments, the inductance component 142 may be referred to as the first circuit, and the capacitance component 144 may be referred to as a second circuit. In some embodiments, the capacitance component 144 may be referred to as a first circuit. As shown in FIG. 1, the power P may be transmitted from the inductance component 142 to the capacitance component 144 through the carrier 110. As shown in FIG. 1, the power P may be transmitted from the inductance component 142 to the capacitance component 144 in a horizontal direction, which is substantially parallel to the surface 120s1 of the protection layer 120.

The capacitance component 146 may be electrically connected between the capacitance component 144 and the electronic component 150. The capacitance component 146 may be configured to regulate the power provided by the power source 130. In some embodiments, the size (e.g., the surface area) of the capacitance component 146 may be less than the size of the capacitance component 144. In some embodiments, the capacitance component 146 may be closer to the electronic component 150 than the capacitance component 144 is. In some embodiments, the capacitance component 146 may be disposed on the surface 110s1 of the carrier 110. In some embodiments, the inductance component 142, the capacitance component 144 and the capacitance component 146 may be collaboratively referred to as a first circuit. In some embodiments, the inductance component 142 and the capacitance component 144 may be referred to as the first circuit, and the capacitance component 146 may be referred to as the second circuit. In some embodiments, the inductance component 142 may be referred to as the first circuit, the capacitance component 144 may be referred to as the second circuit, and the capacitance component 146 may be referred to as a third circuit. In some embodiments, the capacitance component 144 may be referred to as a first circuit, and the capacitance component 146 may be referred to as a second circuit. In some embodiments, the capacitance component 146 may include a plurality of capacitors, such as capacitors 1461 and 1462. In some embodiments, the size of the capacitors 1461 and 1462 may descend in a direction from the capacitance component 144 to the electronic component 150 or in a direction from the power source 130 to the electronic component 150. In some embodiments, the capacitors 1461 and 1462 may be electrically connected in series. As shown in FIG. 1, the power P may be transmitted from the capacitance component 144 to the capacitance component 146 through the carrier 110.

The electronic component 150 may be configured to receive a regulated power from the power source 130. The electronic component 150 may include an XPU, such as a central processing unit (CPU), a graphic processing unit (GPU), a tensor processing unit (TPU) or other components. In some embodiments, the electronic component 150 may be disposed on or in contact with the surface 110s2 of the carrier 110. For example, the terminals of the electronic component 150, such as solder balls or conductive pads, may be disposed on the surface 110s2 of the carrier 110. In some embodiments, the electronic component 150 may be adjacent to the surface 120s1 of the protection layer 120. In some embodiments, the electronic component 150 may be disposed within the protection layer 120. In some embodiments, the electronic component 150 may include active component(s) and passive component(s) disposed on a substrate and embedded in a package body. The active component of the electronic component 150 may include transistors, diodes, or other active components. The transistor may include a bipolar junction transistor, MOSFET, JFET or other transistors. The diode may include Zener diode, photodiode, Schottky diode or other diodes. The passive component of the electronic component 150 may include capacitors, inductors, resistors, or other components. The substrate of the electronic component 150 may include a semiconductor substrate, which may include silicon, germanium, or other suitable materials. As shown in FIG. 1, the power P may be transmitted from the capacitance component 146 to the electronic component 150 through the carrier 110. As shown in FIG. 1, the power P may be transmitted from the capacitance component 146 to the electronic component 150 along a vertical direction, which may be substantially orthogonal to the surface 120s1 of the protection layer 120. As shown in FIG. 1, the power P may be transmitted from the inductance component 142 to the electronic component 150 along the horizontal direction.

In some embodiments, the inductance component 142, and capacitance components 144 and 146 may be collectively configured to regulate the power provided by the power source 130. The inductance component 142 and the capacitance components 144, and 146 receive power and are configured to generate regulated power to the electronic component 150. In some embodiments, the inductance component 142 and the capacitance components 144 and 146 are configured to collectively define a voltage or current regulating device. In some embodiments, the power P is transmitted from the power source 130 to the electronic component 150 through the inductance component 142 and capacitance components 144, and 146 in order. In this embodiment, the inductance component 142 is integrated within the protection layer 120 and extends from the surface 120s1 to the surface 120s2 of the protection layer 120. Since the thickness of the inductance component 142 is enhanced, the inductance of the inductance component 142 is improved. Further, the inductance component 142 is disposed within the protection layer 120, reducing the power routing path between the power source 130 and the inductance component 142. As a result, the regulation of the power provided from the power source 130 can be improved.

Figure 2:
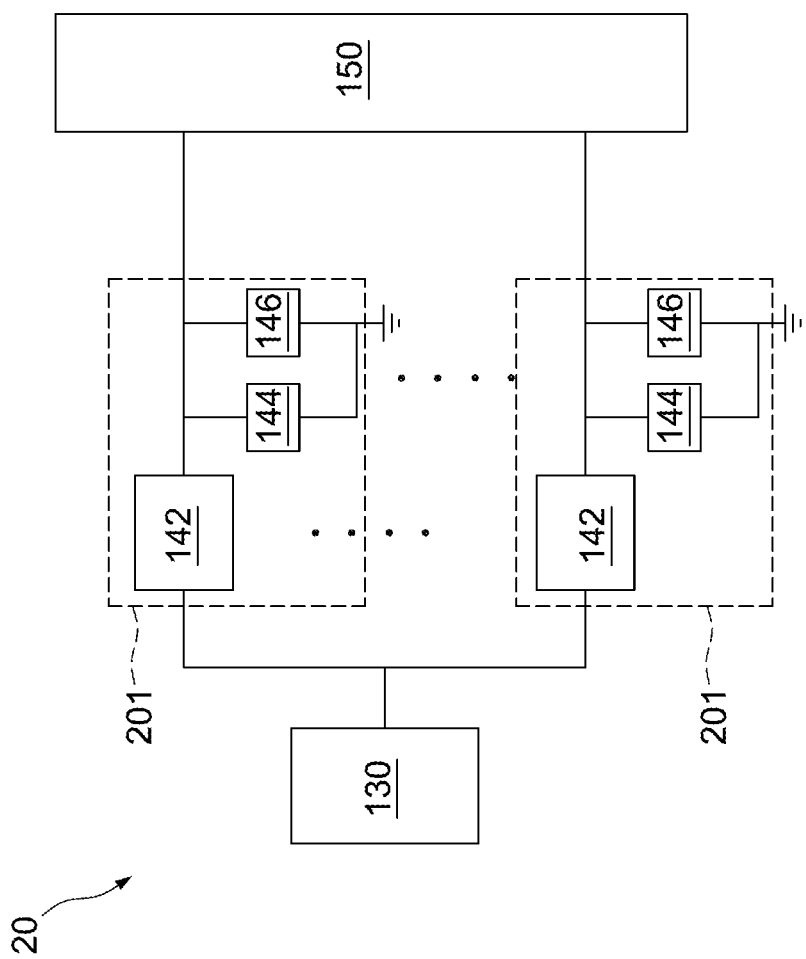
FIG. 2 illustrates a schematic view of a circuit of the semiconductor package structure shown in FIG. 1 according to some embodiments of the present disclosure.

FIG. 2 is a schematic view of a circuit 20 according to some embodiments of the present disclosure. In some embodiments, the circuit 20 may include the semiconductor package structure 10a as shown in FIG. 1. It is contemplated that FIG. 2 is merely illustrative of the electrical relationship among the power 130, the inductance component 142, capacitance components 144, 146, and the electronic component 150, and the circuit 20 may further include other conductive components.

As shown in FIG. 2, the circuit 20 may include a plurality of inductance components 142, a plurality of capacitance components 144, and a plurality of capacitance components 146. In some embodiments, at least one inductance component 142, at least one capacitance component 144, and at least one capacitance component 146 may constitute a subcircuit 201 electrically connected between the power source 130 and the electronic component 150. In some embodiments, the circuit 20 may include a plurality of subcircuits 201. In some embodiments, each of the subcircuits 201 may be electrically connected to the power source 130 in parallel. In some embodiments, the inductance component 142 may be electrically connected between the power source 130 and the capacitance component 144. In some embodiments, the capacitance component 144 or 146 may be electrically connected between the inductance component 142 and the electronic component 150. In some embodiments, the inductance component 142 may be electrically connected between the power source 130 and the capacitance component 146. In some embodiments, the capacitance components 144 and 146 in one subcircuit 201 may be electrically connected to the inductance component 142 in parallel. In some embodiments, the capacitance components 144 and 146 in one subcircuit 201 may be electrically connected to the electronic component 150 in parallel. In some embodiments, the capacitance component 144 and/or the capacitance component 146 may be electrically connected to ground.

Figure 3:
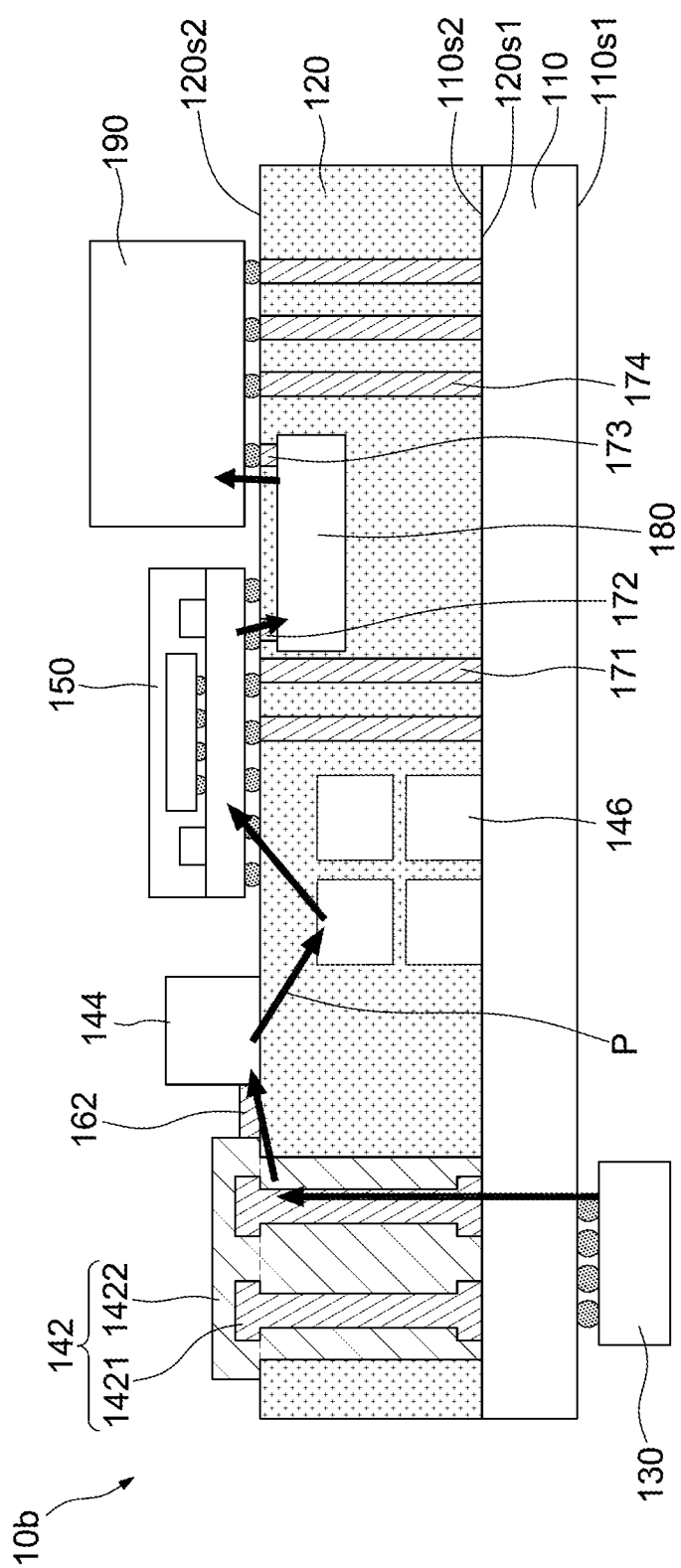
FIG. 3 illustrates a cross-sectional view of an example of a semiconductor package structure according to some embodiments of the present disclosure.

FIG. 3 illustrates a cross-sectional view of an example of a semiconductor package structure 10b according to some embodiments of the present disclosure. The semiconductor package structure 10b of FIG. 3 has a structure similar to that of the semiconductor package structure 10a of FIG. 1, differing in that the semiconductor package structure 10b may further include a conductive layer 162, conductive pillars 171, 172, 173, 174, a connection component 180, and a storage device 190.

The conductive layer 162 may be disposed on the surface 120s2 of the protection layer 120. The conductive layer 162 may be configured to electrically connect the inductance component 142 and the capacitance component 144. In some embodiments, the material of the conductive layer 162 may be the same as that of the conductive structure 1421 of the inductance component 142. In some embodiments, the thickness of the conductive layer 162 may be the same as that of the conductive structure 1421 of the inductance component 142.

The conductive pillars 171, 172, 173, and 174 may be disposed within the protection layer 120. The conductive pillars 171, 172, 173, and 174 may be configured to electrically connect different components. In some embodiments, the electronic component 150 may be electrically connected to the carrier 110 through the conductive pillar 171. In some embodiments, the electronic component 150 may be electrically connected to the connection component 180 through the conductive pillar 172. In some embodiments, the connection component 180 may be electrically connected to the storage device 190 through the conductive pillar 173. In some embodiments, the storage device 190 may be electrically connected to the carrier 110 through the conductive pillar 174. The conductive pillars 171, 172, 173, and 174 may include conductive materials, such as copper (Cu), tin (Sn), aluminum (Al), gold (Au), silver (Ag), tungsten (W), nickel (Ni), or other suitable materials.

The connection component 180 may be configured to connect the electronic component 150 and the storage device 190. In some embodiments, the connection component 180 may be adjacent to the surface 120s2 of the protection layer 120. In some embodiments, the connection component 180 may be spaced apart from the surface 120s2 of the protection layer 120. In some embodiments, the connection component 180 may be disposed within the protection layer 120. The connection component 180 may include, for example, a bridge die. In some embodiments, the connection component 180 may include at least one of a passive component and an active component. In some embodiments, the connection component 180 may include a semiconductor die and a redistribution structure connecting the electronic component 150 and the storage device 190, embedded in the semiconductor die.

The storage device 190 may be disposed on the surface 120s2 of the protection layer 120. The storage device 190 may include a high bandwidth memory (HBM) or other components.

In some embodiments, the power source 130 may be disposed on the surface 110s1 of the carrier 110. In some embodiments, the power source 130 may be below the inductance component 142 so that the power P may be provided in a vertical direction, which is substantially perpendicular to the surface 120s1 of the protection layer 120.

In some embodiments, the capacitance component 144 may be disposed on the surface 120s2 of the protection layer 120. In some embodiments, the capacitance component 146 may be disposed adjacent to the surface 120s1 of the protection layer 120. In some embodiments, the capacitance component 146 may be disposed within the protection layer 120.

In some embodiments, the electronic component 150 may be disposed on the surface 120s2 of the protection layer 120. In this embodiment, the electronic component 150 is configured to transmit a signal (or power P) to the storage device 190 through the connection component 180 in the horizontal direction, which is substantially parallel to the surface 120s2 of the protection layer 120.

In this embodiment, the inductance component 142 is disposed within the protection layer 120, reducing the conductive path between the power source 130 and the inductance component 142. Further, the semiconductor package structure 10c integrates the inductance component 142 and the storage device 190, and the electronic component 150 can provide a regulated signal to the storage device 190 with a higher speed.

Figure 4:
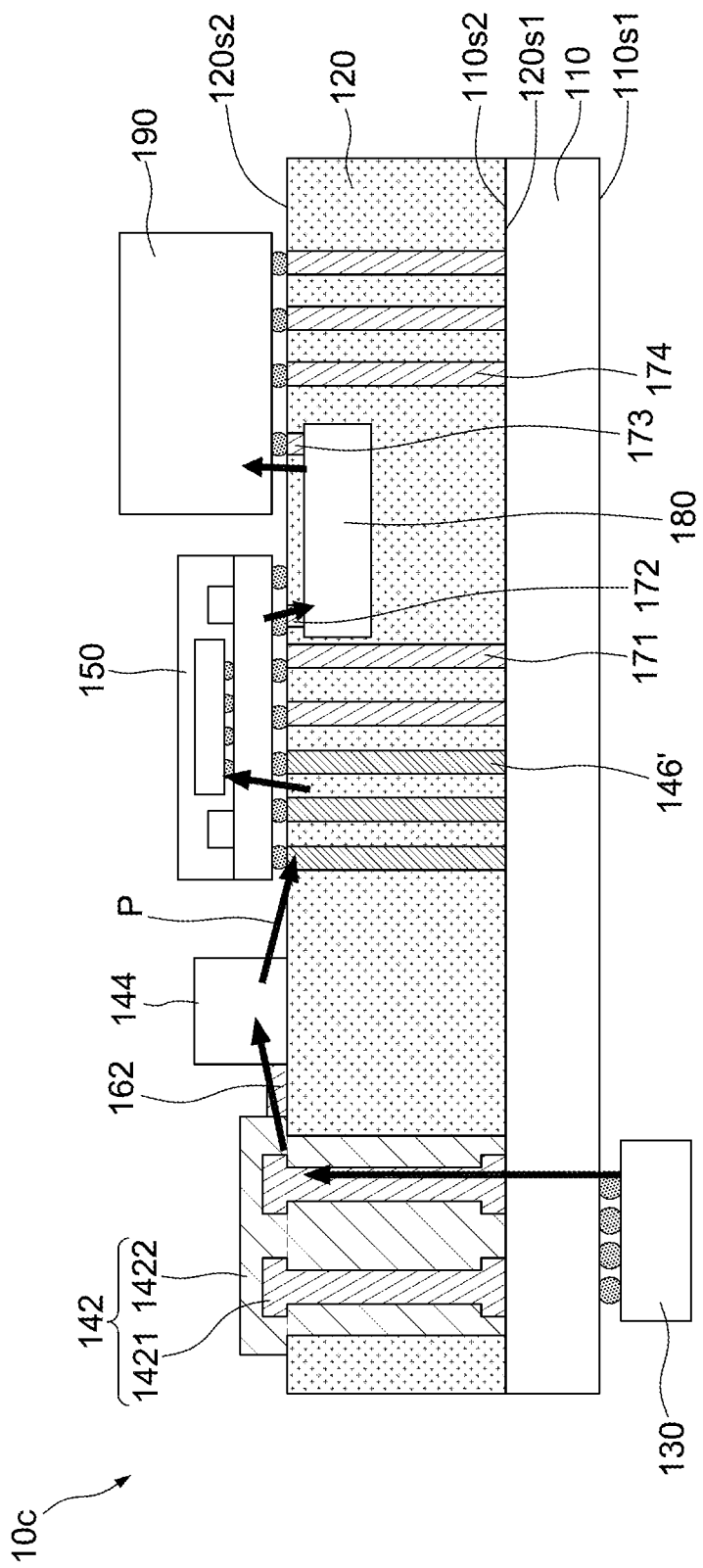
FIG. 4 illustrates a cross-sectional view of an example of a semiconductor package structure according to some embodiments of the present disclosure.

FIG. 4 illustrates a cross-sectional view of an example of a semiconductor package structure 10c according to some embodiments of the present disclosure. The semiconductor package structure 10c of FIG. 4 has a structure similar to that of the semiconductor package structure 10b of FIG. 3, differing in that the semiconductor package structure 10c may further include a capacitance component 146' replacing the capacitance component 146. In some embodiments, the capacitance component 146' may be disposed within the protection layer 120. In some embodiments, the capacitance component 146' may extend from the surface 120s1 to the surface 120s2 of the protection layer 120. In some embodiments, the capacitance component 146' may fully penetrate the protection layer 120.

Figure 5:
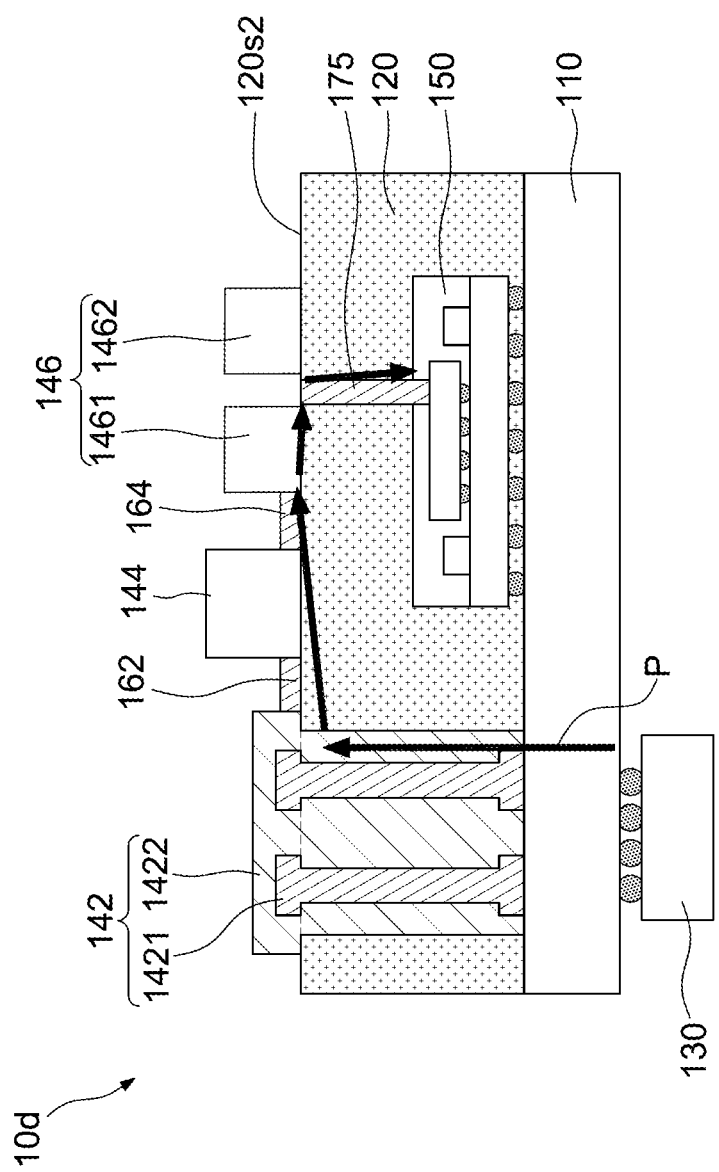
FIG. 5 illustrates a cross-sectional view of an example of a semiconductor package structure according to some embodiments of the present disclosure.

FIG. 5 illustrates a cross-sectional view of an example of a semiconductor package structure 10d according to some embodiments of the present disclosure. The semiconductor package structure 10d of FIG. 5 has a structure similar to that of the semiconductor package structure 10a of FIG. 1, differing in that the semiconductor package structure 10d may further include a conductive layer 164 and a conductive pillar 175.

The conductive layer 164 may be disposed on the surface 120s2 of the protection layer 120. The conductive layer 164 may be configured to electrically connect the capacitance components 144 and 146. In some embodiments, the material of the conductive layer 164 may be the same as that of the conductive structure 1421 of the inductance component 142. In some embodiments, both the capacitance components 144 and 146 may be disposed on the surface 120s2 of the protection layer 120.

The conductive pillar 175 may be disposed within the protection layer 120. The conductive pillar 175 may be configured to electrically connect the capacitance component 146 and the electronic component 150. As shown in FIG. 5, the power P may be transmitted from the inductance component 146 to the electronic component 150 along a vertical direction.

As shown in FIG. 1, FIG. 3, FIG. 4, and FIG. 5, the inductance component 142 may be disposed within the protection layer 120 to reduce the power routing path between the power source 130 and the inductance component 142. As a result, the regulation of the power provided from the power source 130 can be improved. Further, the layouts of the inductance component 142, capacitance components 144, 146, power source 130, and electronic component 150 can be designed flexibly.

Figure 6:
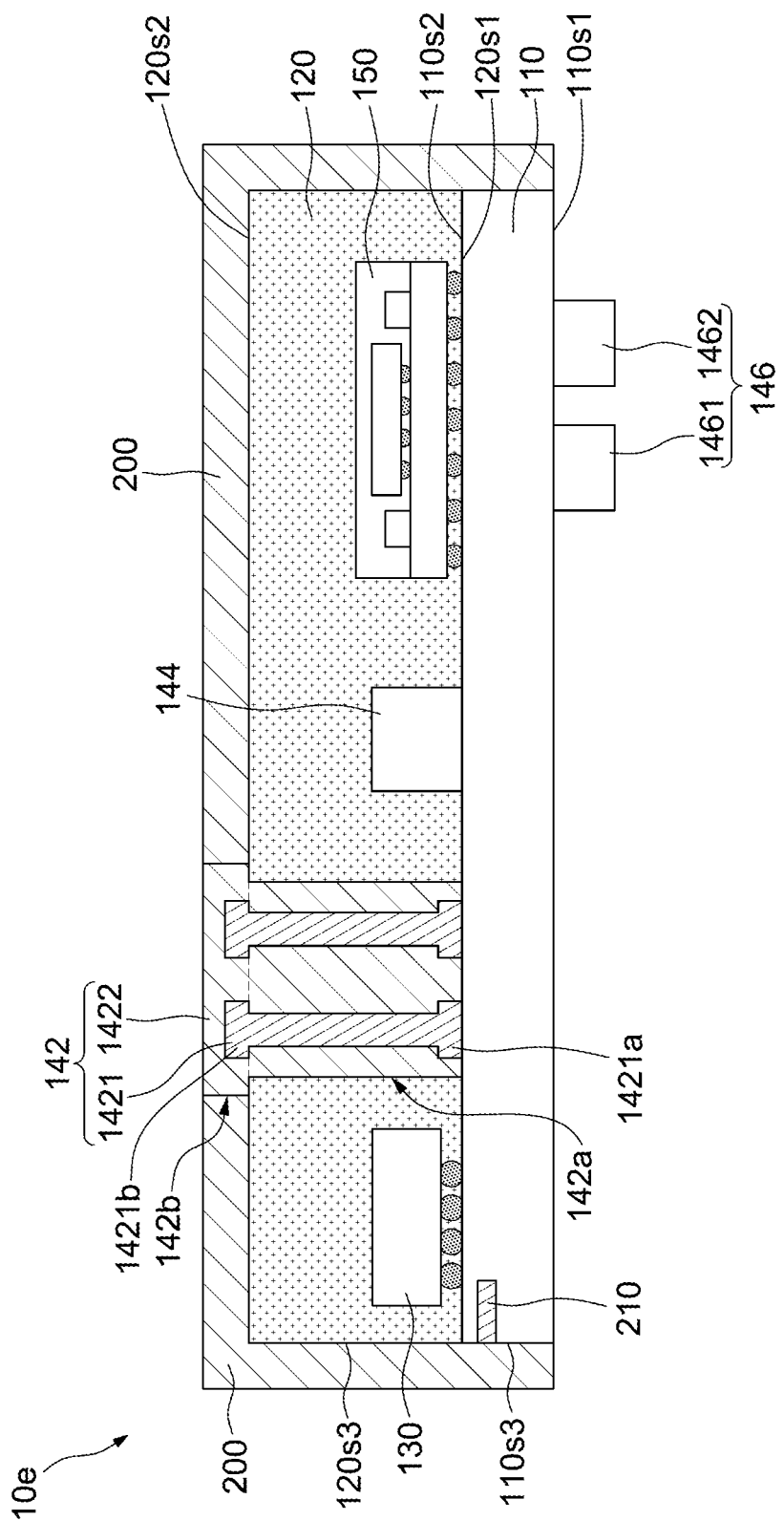
FIG. 6 illustrates a cross-sectional view of an example of a semiconductor package structure according to some embodiments of the present disclosure.

FIG. 6 illustrates a cross-sectional view of an example of a semiconductor package structure 10e according to some embodiments of the present disclosure. The semiconductor package structure 10e of FIG. 6 has a structure similar to that of the semiconductor package structure 10a of FIG. 1, differing in that the semiconductor package structure 10e may further include a shielding layer 200.

In some embodiments, the shielding layer 200 may be disposed on the surface 120s2 of the protection layer 120. The shielding layer 200 may extend from the dielectric layer 1422 of the inductance component 142. In some embodiments, the shielding layer 200 may extend along the external surface (e.g., the surfaces 120s2 and 120s3) of the protection layer 120 and the surface 110s3 of the carrier 110. The shielding layer 200 is electrically connected to or in contact with a grounding layer 210, which is exposed by the surface 110s3 of the carrier 110. The shielding layer 200 may be configured to provide low-frequency electromagnetic interference (EMI) shielding. The shielding layer 200 may include, for example, magnetic materials. The magnetic materials may include a ferromagnetic material. The magnetic materials may include at least one of ferrite and metal magnetic material. The magnetic materials may include Fe-based amorphous powder, Ni—Zn ferrite, Mn—Zn ferrite or other suitable materials. The Fe-based amorphous powder may be a composite, including Fe, Si, B, Cr, C or other elements, coated by a dielectric layer, such as $SiO_2$. In some embodiments, the material of the shielding layer 200 may be the same as that of the dielectric layer 1422 of the inductance component 142.

Figure 7:
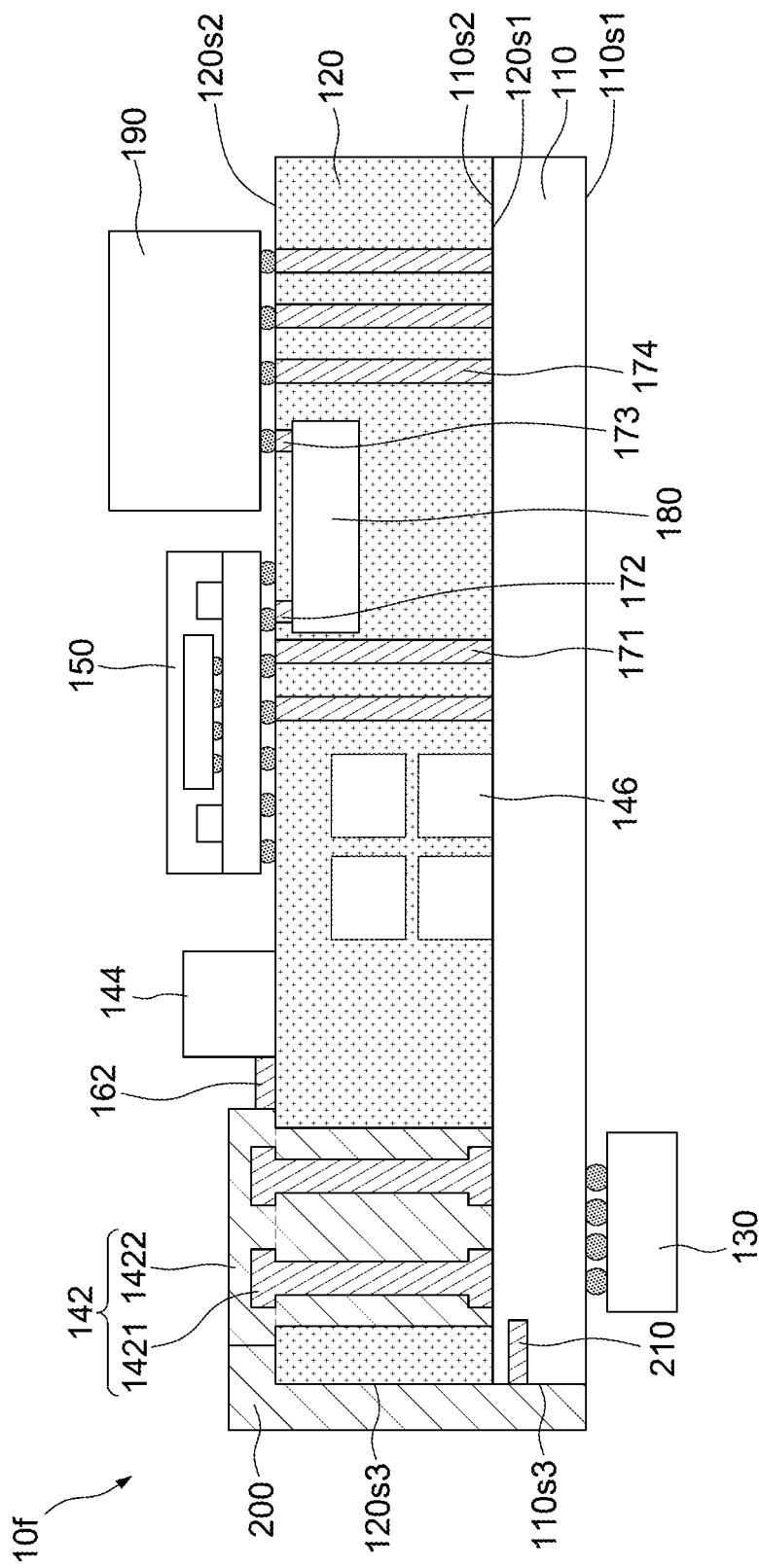
FIG. 7 illustrates a cross-sectional view of an example of a semiconductor package structure according to some embodiments of the present disclosure.

FIG. 7 illustrates a cross-sectional view of an example of a semiconductor package structure 10f according to some embodiments of the present disclosure. The semiconductor package structure 10f of FIG. 7 has a structure similar to that of the semiconductor package structure 10b of FIG. 3, differing in that the semiconductor package structure 10f may further include the shielding layer 200. In some embodiments, the shielding layer 200 may extend along the external surface (e.g., the surfaces 120s2 and 120s3) of the protection layer 120 to provide low-frequency electromagnetic interference (EMI) shielding.

Figure 8:
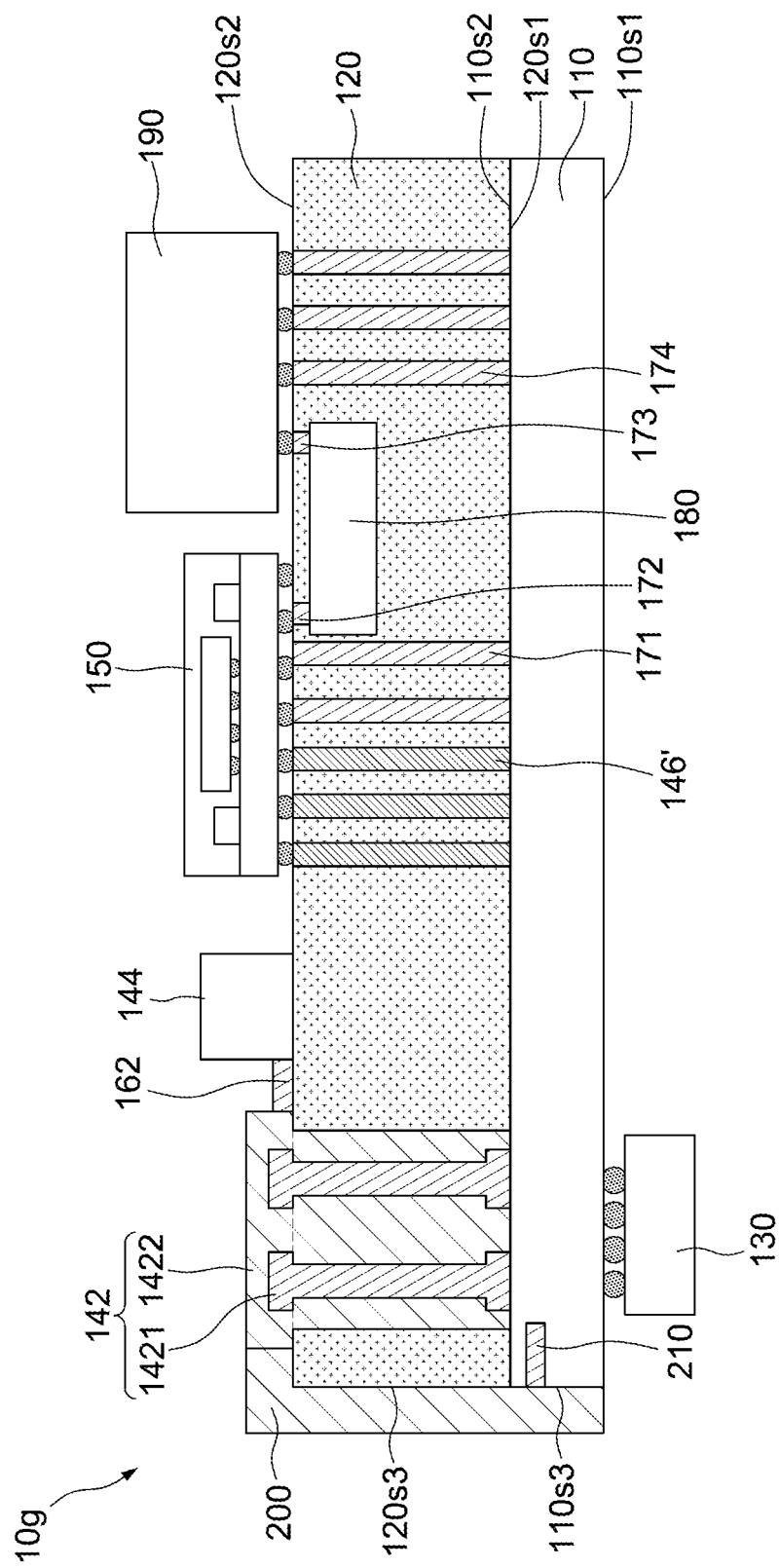
FIG. 8 illustrates a cross-sectional view of an example of a semiconductor package structure according to some embodiments of the present disclosure.

FIG. 8 illustrates a cross-sectional view of an example of a semiconductor package structure 10g according to some embodiments of the present disclosure. The semiconductor package structure 10g of FIG. 8 has a structure similar to that of the semiconductor package structure 10c of FIG. 4, differing in that the semiconductor package structure 10g may further include the shielding layer 200. In some embodiments, the shielding layer 200 may extend along the external surface (e.g., the surfaces 120s2 and 120s3) of the protection layer 120 to provide low-frequency electromagnetic interference (EMI) shielding.

Figure 9:
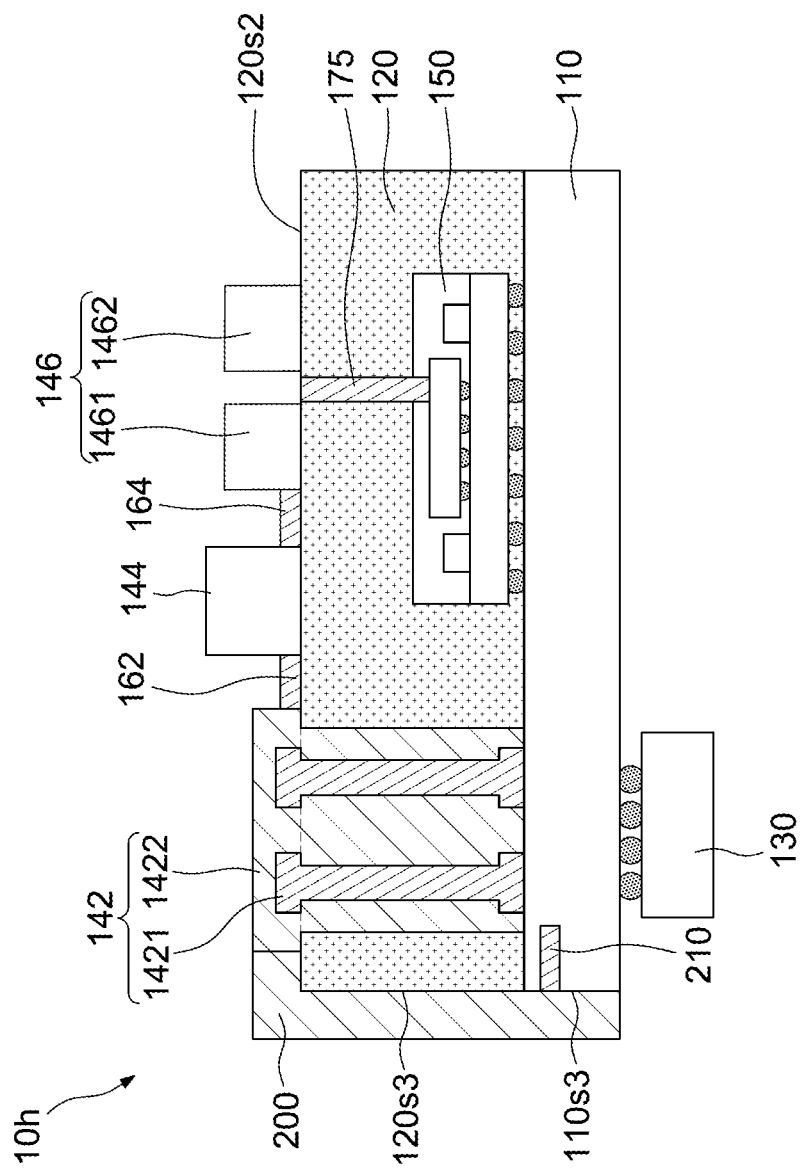
FIG. 9 illustrates a cross-sectional view of an example of a semiconductor package structure according to some embodiments of the present disclosure.

FIG. 9 illustrates a cross-sectional view of an example of a semiconductor package structure 10h according to some embodiments of the present disclosure. The semiconductor package structure 10h of FIG. 9 has a structure similar to that of the semiconductor package structure 10d of FIG. 5, differing in that the semiconductor package structure 10h may further include a shielding layer 200. In some embodiments, the shielding layer 200 may extend along the external surface (e.g., the surfaces 120s2 and 120s3) of the protection layer 120 to provide low-frequency electromagnetic interference (EMI) shielding.

FIG. 10A, FIG. 10B, FIG. 10C, FIG. 10D, FIG. 10E, FIG. 10F and FIG. 10G illustrate various stages of an exemplary method for manufacturing a semiconductor package structure, such as the semiconductor package structure 10a shown in FIG. 1. The process shown in FIG. 10A-FIG. 10G is merely an example, and is not intended to limit the present disclosure beyond what is explicitly recited in the claims. Additional stages can be provided before, during, and after stages shown in FIG. 10A-FIG. 10G, and some stages described can be replaced, eliminated, or moved around for additional embodiments of the method.

Figure 10A:
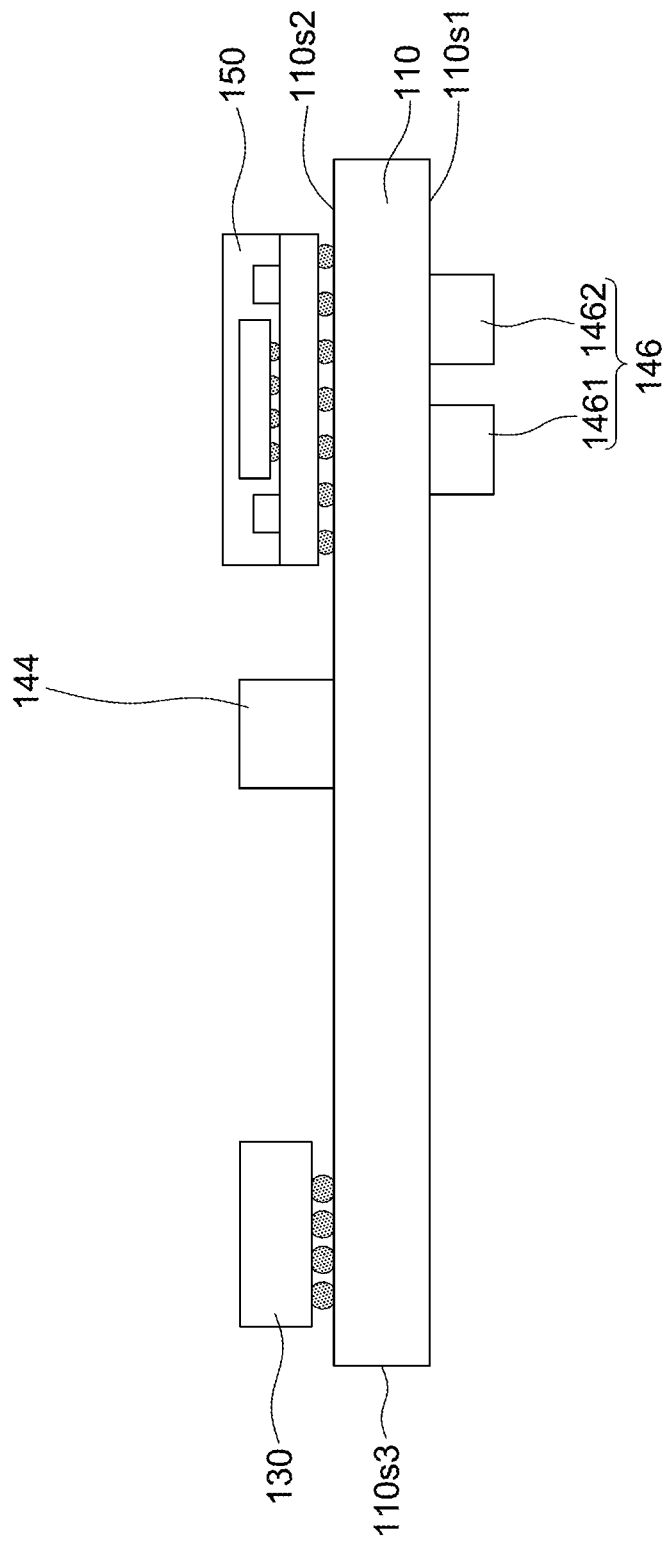
FIG. 10A, FIG. 10B, FIG. 10C, FIG. 10D, FIG. 10E, FIG. 10F and FIG. 10G illustrate various stages of an example of a method for manufacturing a semiconductor package structure according to some embodiments of the present disclosure.

Referring to FIG. 10A, the carrier 110 is provided. The power source 130, capacitance component 144, and electronic component 150 may be attached to the surface 110s2 of the carrier 110. The capacitance component 146 may be attached to the surface 110s1 of the carrier 110.

Figure 10B:
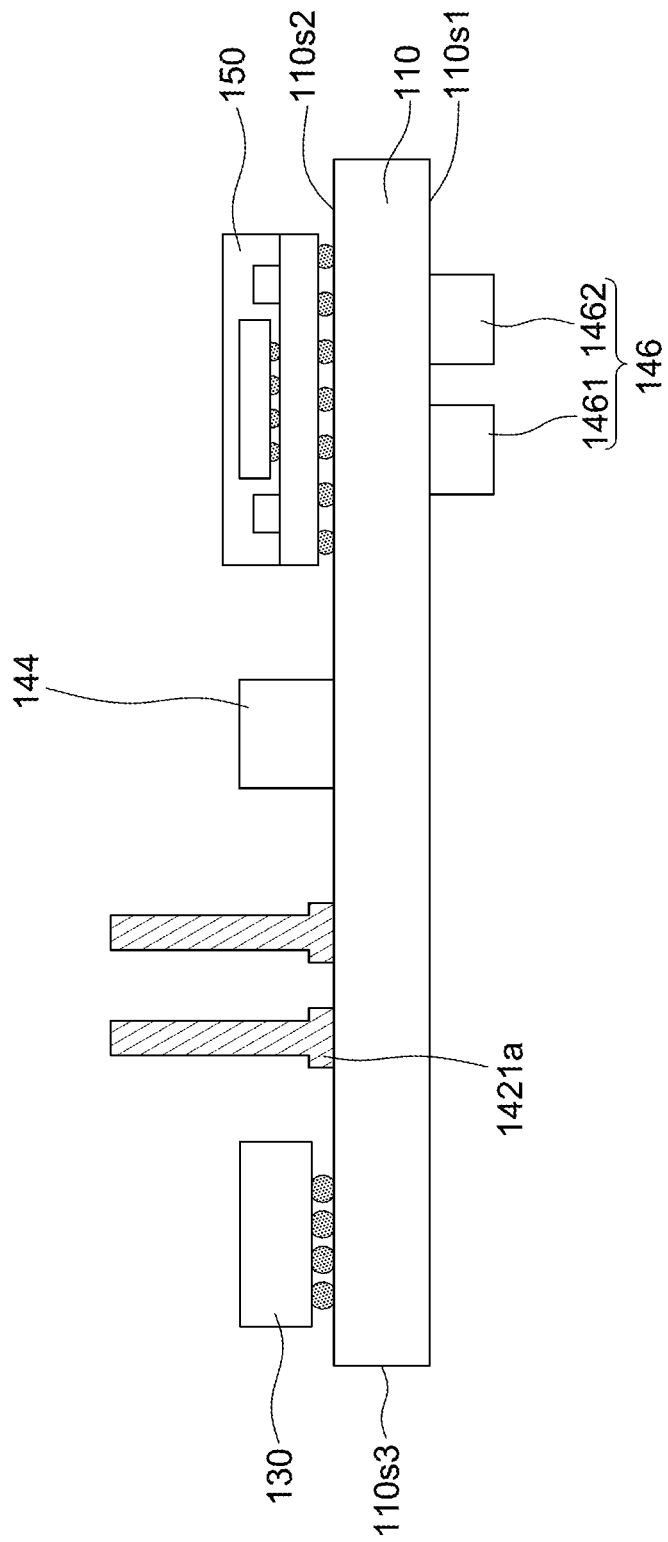

Referring to FIG. 10B, the conductive layer 1421a (or the portion 1421a of the conductive structure 1421) may be formed on the surface 110s2 of the carrier 110. In some embodiments, a seed layer (not shown) and a photosensitive layer (not shown) may be formed on the surface 110s2 of the carrier 110. Next, the photosensitive layer may be patterned to form a plurality of openings (not shown), and a conductive material may be formed on the seed layer to fill the openings of the photosensitive layer. As a result, the conductive layer 1421a may be produced. The remaining photosensitive layer and the seed layer covered by the photosensitive layer may be removed.

Figure 10C:
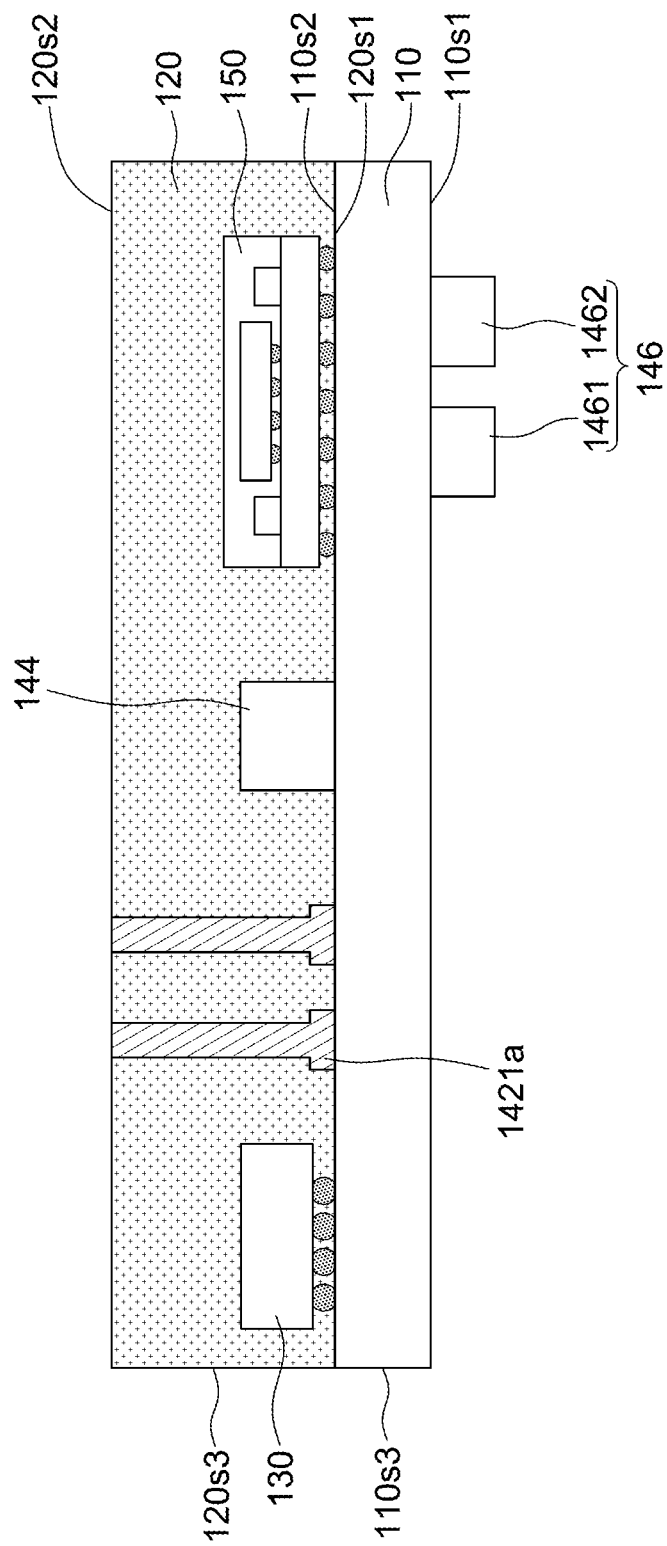

Referring to FIG. 10C, the protection layer 120 may be formed to cover the surface 110s2 of carrier 110. In some embodiments, the protection layer 120 may be formed to cover the power source 130, conductive layer 1421a, capacitance component 144 and the electronic component 150. A grinding operation may be performed on the protection layer 120 until the conductive layer 1421a is exposed by the surface 120s2 of the protection layer 120.

Figure 10D:
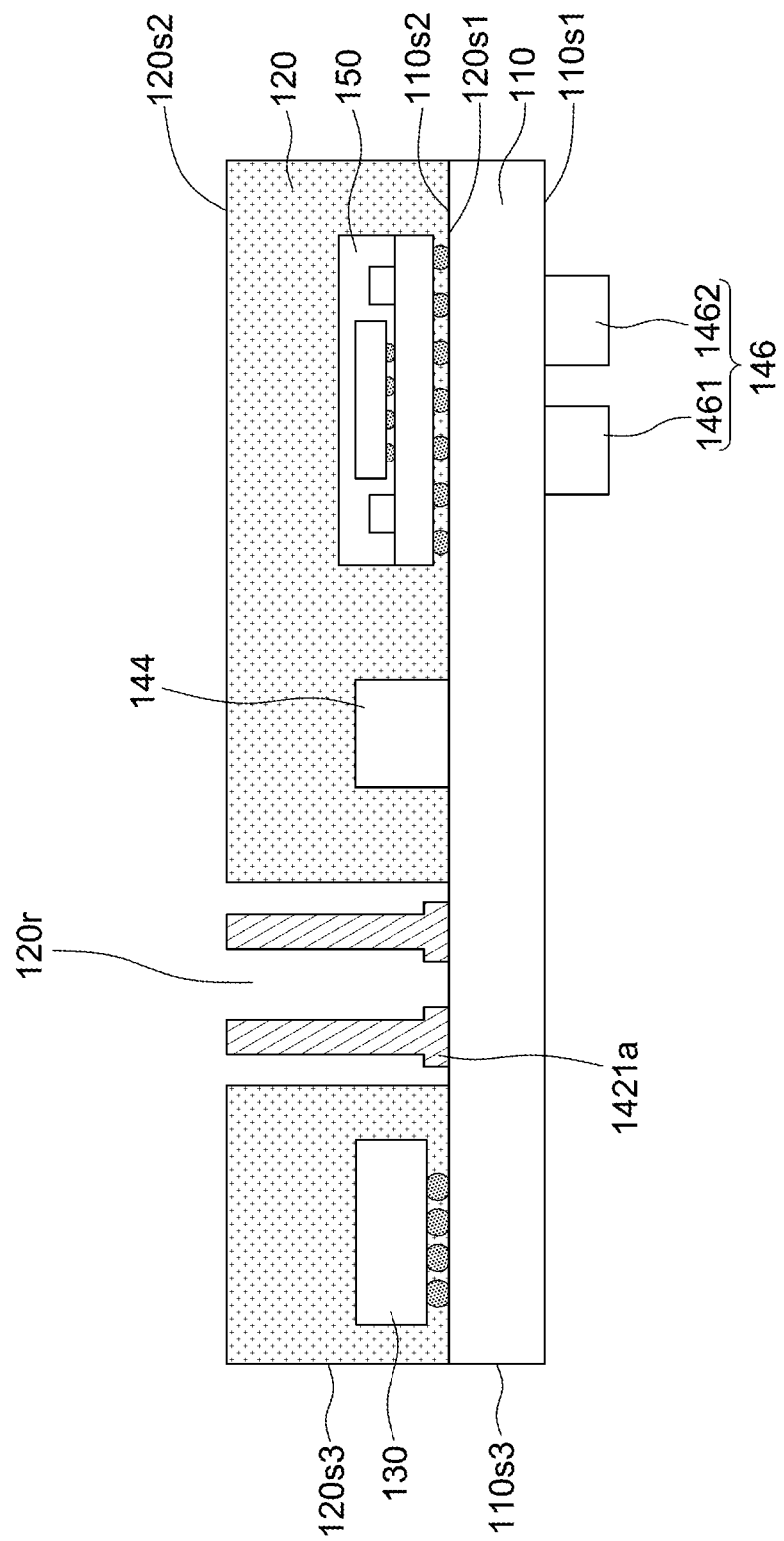

Referring to FIG. 10D, etching may be performed to form an opening 120r exposing a portion of the surface 120s1 of the protection layer 120. The side surface of the conductive layer 1421a may be exposed to the opening 120r.

Figure 10E:
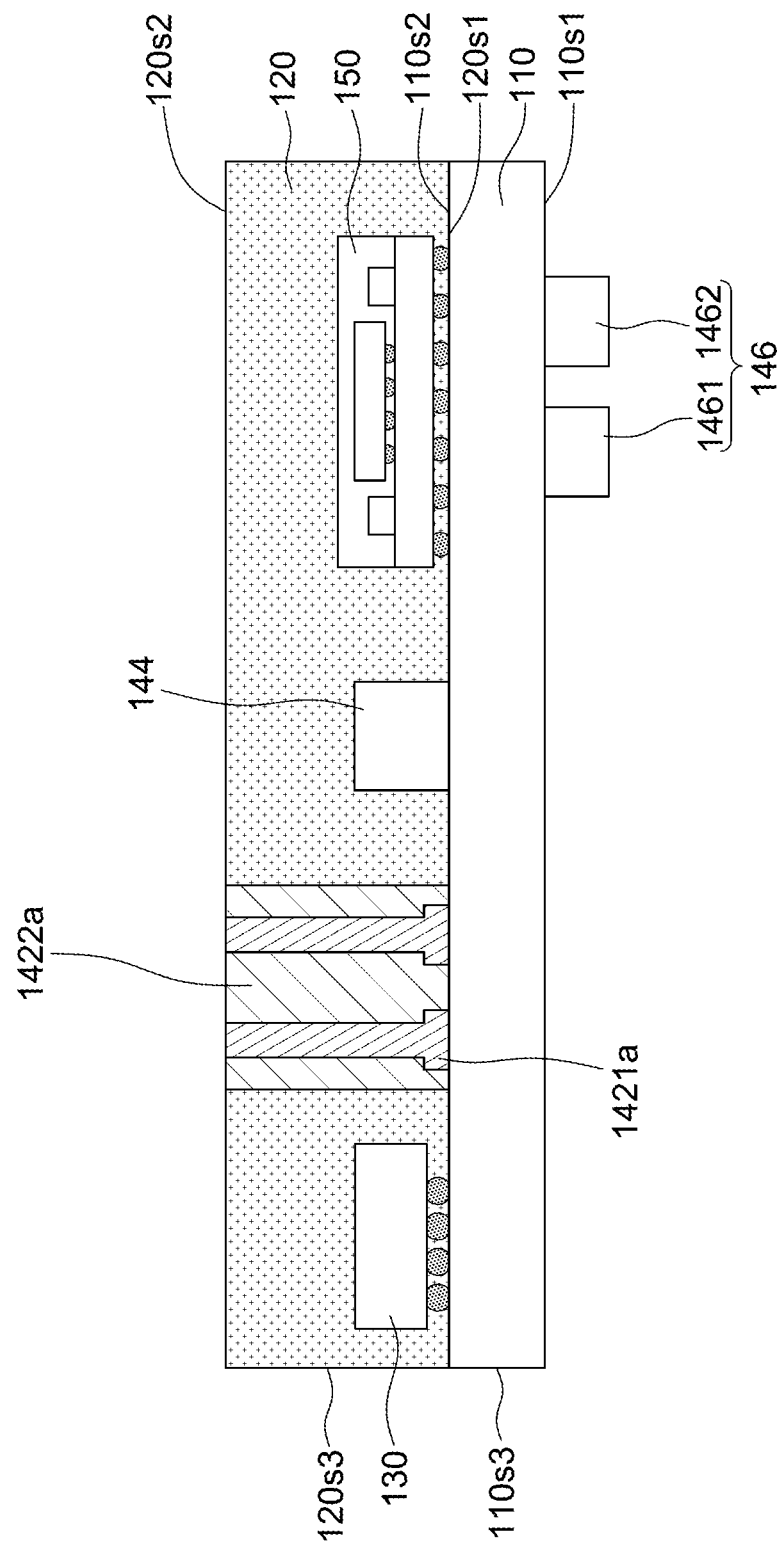

Referring to FIG. 10E, a dielectric layer 1422a may be formed to fill the opening 120r of the protection layer 120. The dielectric layer 1422a may cover the side surface of the conductive layer 1421a.

Figure 10F:
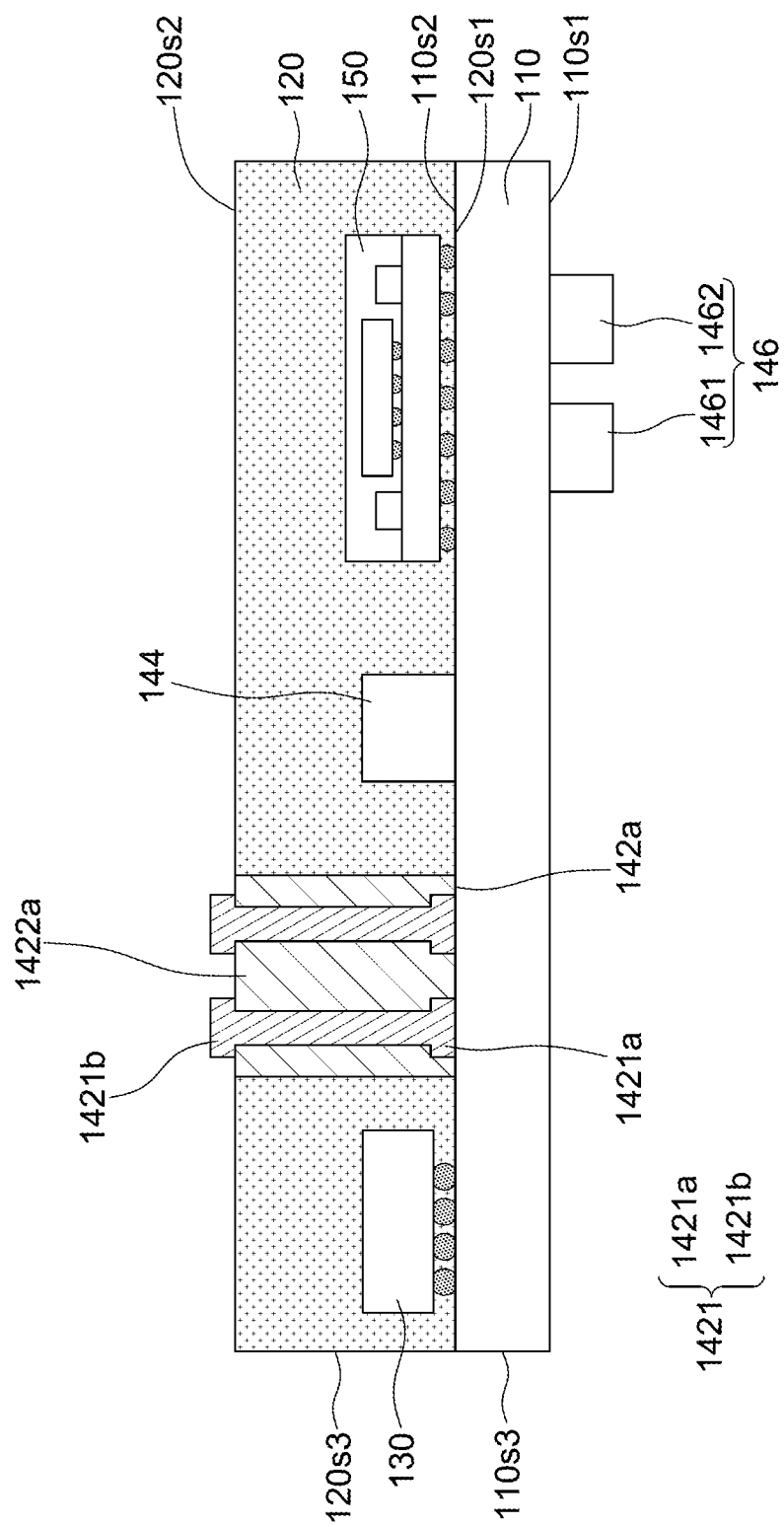

Referring to FIG. 10F, the conductive layer 1421b (or the portion 1421b of the conductive structure 1421) may be formed on the conductive layer 1421a and on the dielectric layer 1422a to produce the conductive structure 1421.

Figure 10G:
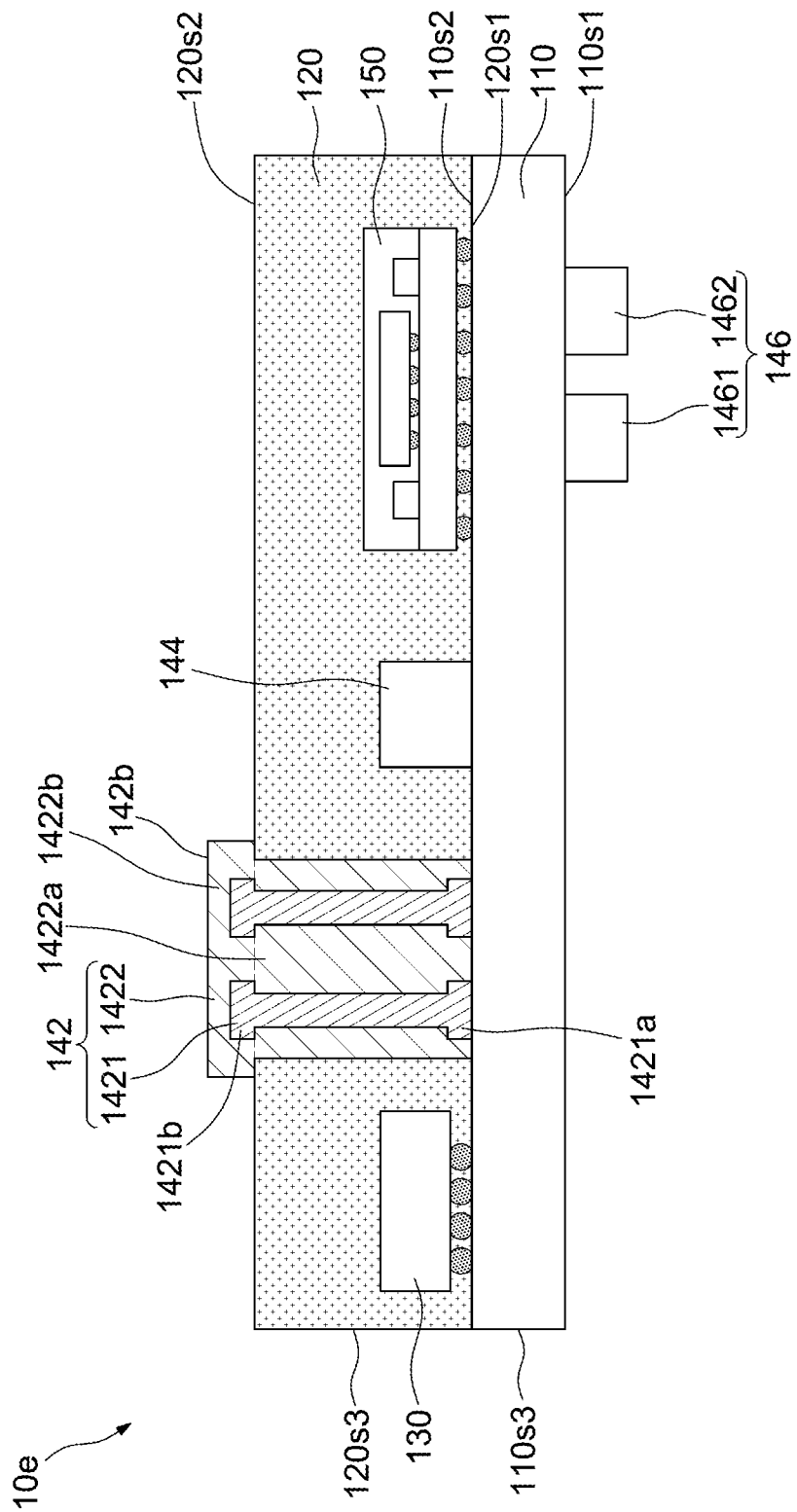

Referring to FIG. 10G, the dielectric layer 1422b may be formed to cover the conductive structure 1421 and the dielectric layer 1422a. As a result, the semiconductor package structure 10a may be produced.

Figure 11:
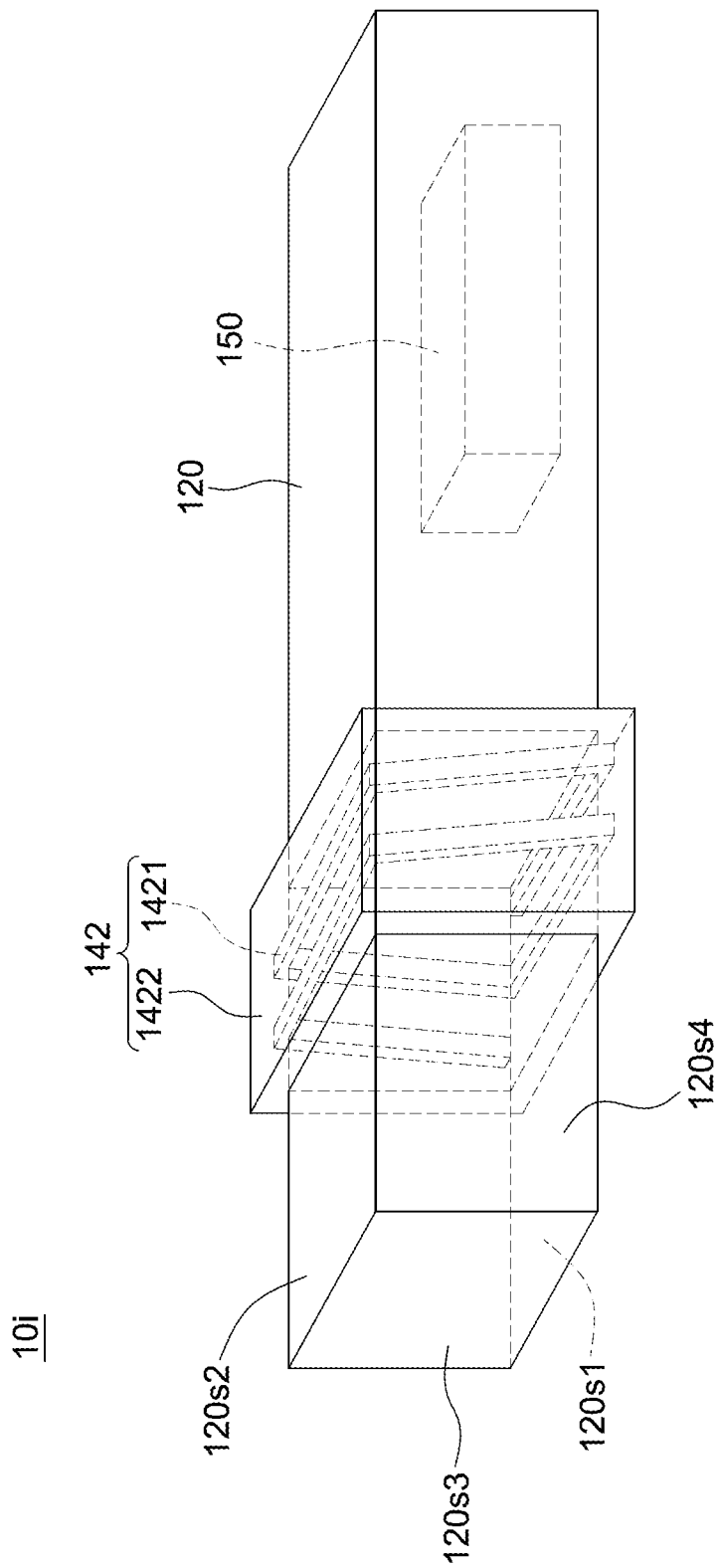
FIG. 11 illustrates a perspective view of an example of a semiconductor package structure according to some embodiments of the present disclosure.

FIG. 11 illustrates a perspective view of an example of a semiconductor package structure 10i according to some embodiments of the present disclosure. It should be noted that some elements are omitted for brevity.

In some embodiments, the inductance component 142 may outflank the space from the surface 120s2 and the surface 120a1 of the protection layer 120. In some embodiments, the inductance component 142 may be in contact with surfaces 120s1, 120s2 and 120s4 of the protection layer 120. The surface 120s4 (or a lateral surface) may be orthogonal to or adjacent to the surface 120s3. In some embodiments, the dielectric layer 1422b of the inductance component 142 may outflank the space from the surface 120s2 and the surface 120a1 of the protection layer 120. In some embodiments, the conductive structure 1421 of the inductance component 142 may have a spiral profile from a perspective view. In some embodiments, the conductive structure 1421 of the inductance component 142 may outflank the space from the surface 120s2 and the surface 120a1 of the protection layer 120. In some embodiments, the conductive structure 1421 of the inductance component 142 may be in contact with surfaces 120s1, 120s2 and 120s4 of the protection layer 120. Further, as shown in FIG. 11, the electronic component 150 may be embedded in the protection layer 120. For example, the surfaces 120s1 and 120s2 of the protection layer 120 may collectively define a space to accommodate the electronic component 150. In some embodiments, the inductance component 142 have a portion overlapped with the protection layer 120 in a lateral side view. For example, the inductance component 142 may have a portion overlapped with the surface 120s4 of the protection layer 120 in a lateral side view. Further, a portion of the inductance component 142 may be disposed over or on the surface 120s2 of the protection layer 120.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
   a protection layer having a first surface and a second surface opposite to the first surface;
   a first circuit extending from the first surface of the protection layer to the second surface of the protection layer and configured to regulate a power;
   an electronic component adjacent to the protection layer and configured to receive a regulated power from the first circuit, wherein the electronic component is disposed over the protection layer;
   a capacitance component electrically connecting the first circuit and the electronic component; and
   a second circuit within the protection layer and electrically connecting the capacitance component to the electronic component.

2. The semiconductor device package of claim 1, wherein the first circuit, the capacitance component, and the second circuit are configured to collectively define a voltage or current regulating device.

3. The semiconductor device package of claim 1, wherein the second circuit comprises a capacitor.

4. The semiconductor device package of claim 1, wherein the second circuit extends from the first surface to the second surface of the protection layer.

5. The semiconductor device package of claim 1, wherein the second circuit vertically overlaps the electronic component.

6. The semiconductor device package of claim 1, wherein the first circuit, the second circuit, and the capacitance component do not vertically overlap.

7. The semiconductor device package of claim 1, further comprising:

a storage device over the protection layer; and a connection component within the protection layer and electrically connecting the electronic component to the storage device.

8. The semiconductor device package of claim 7, wherein the connection component is spaced apart from the first surface and the second surface of the protection layer.

9. The semiconductor device package of claim 7, wherein the connection component comprises a semiconductor die.

10. The semiconductor device package of claim 7, further comprising:

a carrier disposed under the protection layer.

11. The semiconductor device package of claim 10, further comprising:

a first conductive pillar within the protection layer and electrically connecting the electronic component to the carrier.

12. The semiconductor device package of claim 11, wherein the first conductive pillar is disposed between the connection component and the second circuit.

13. The semiconductor device package of claim 11, further comprising:

a second conductive pillar within the protection layer and electrically connecting the storage device to the carrier.

14. The semiconductor device package of claim 13, wherein the connection component is disposed between the second conductive pillar and the first conductive pillar.

15. The semiconductor device package of claim 13, wherein a quantity of the second conductive pillar is greater than that of the first conductive pillar.

16. The semiconductor device package of claim 7, wherein a portion of the connection component vertically overlaps the electronic component and the storage device.

17. The semiconductor device package of claim 7, wherein the electronic component is configured to transmit a power to the storage device through the connection component.

* * * * *